US012787822B2

(12) United States Patent
Pham et al.

(10) Patent No.: US 12,787,822 B2
(45) Date of Patent: Nov. 3, 2026

(54) INTEGRATED ELECTRONIC MODULE WITH LAMINATED BRIDGE ASSEMBLY

(71) Applicant: Analog Devices, Inc., Wilmington, MA (US)

(72) Inventors: Hien Minh Pham, Fremont, CA (US); Melvin Sto Domingo Nava, Morgan Hill, CA (US)

(73) Assignee: Analog Devices, Inc., Wilmington, MA (US)

( * ) Notice: Subject to any disclaimer, the term of this patent is extended or adjusted under 35 U.S.C. 154(b) by 412 days.

(21) Appl. No.: 18/495,607

(22) Filed: Oct. 26, 2023

(65) Prior Publication Data

US 2025/0140699 A1 May 1, 2025

(51) Int. Cl.
*H10W 70/65* (2026.01)
*H10W 70/60* (2026.01)
*H10W 90/00* (2026.01)

(52) U.S. Cl.
CPC .......... *H10W 70/65* (2026.01); *H10W 70/611* (2026.01); *H10W 90/00* (2026.01)

(58) Field of Classification Search
None
See application file for complete search history.

(56) References Cited

U.S. PATENT DOCUMENTS 7,236,368 B2 * 6/2007 Maxwell ................ H05K 7/209 257/722
8,593,817 B2 * 11/2013 Bayerer ................ H02M 7/003 257/772
10,440,813 B1 * 10/2019 Li ........................ H05K 1/0204
2003/0173673 A1 * 9/2003 Val ...................... H10W 20/423 257/E23.114
2009/0297785 A1 * 12/2009 Ueda ...................... H05K 3/281 156/89.12
2013/0329376 A1 * 12/2013 Racz ....................... H10P 72/74 361/728
2014/0218883 A1 * 8/2014 Dakhiya ............. H05K 1/0284 29/830

(Continued)

OTHER PUBLICATIONS

"3D-MID", Harting AG—MID, (Aug. 27, 2021), 4 pgs.

*Primary Examiner* — Krystal Robinson
(74) *Attorney, Agent, or Firm* — Schwegman Lundberg & Woessner, P.A.

(57) ABSTRACT

An integrated electronic module assembly may include a substrate comprising conductive regions on opposite surfaces of the substrate and a laminated bridge assembly. The laminated bridge assembly may include a dielectric material, the dielectric material forming a planar region and respective legs defining a cavity region, the respective legs including at least one respective inter-layer interconnection. The laminated bridge assembly may also include a conductive layer, the conductive layer defining at least one respective pad region electrically coupled to the at least one respective inter-layer interconnection. The laminated bridge assembly may be electrically and mechanically coupled to the substrate, the substrate including a first surface including a respective conductive region to which the at least one respective inter-layer interconnection is electrically coupled and an opposite second surface including respective conductive regions forming terminals of the integrated electronic module assembly.

20 Claims, 10 Drawing Sheets

(56) References Cited

U.S. PATENT DOCUMENTS

| | | | | |
|---|---|---|---|---|
| 2014/0225265 | A1* | 8/2014 | Sidhu | H10W 20/059<br>257/758 |
| 2014/0268780 | A1* | 9/2014 | Wang | F21K 9/90<br>362/249.06 |
| 2016/0056102 | A1* | 2/2016 | Konchady | H10P 72/74<br>174/263 |
| 2020/0303318 | A1* | 9/2020 | Morris | H10W 20/043 |
| 2021/0127479 | A1* | 4/2021 | Yu | H05K 3/423 |
| 2023/0247754 | A1* | 8/2023 | Haraguchi | H05K 1/0204<br>174/252 |
| 2023/0387073 | A1* | 11/2023 | Wu | H10W 70/611 |
| 2025/0054680 | A1* | 2/2025 | Hong | H01F 27/24 |

* cited by examiner

INTEGRATED ELECTRONIC MODULE WITH LAMINATED BRIDGE ASSEMBLY

TECHNOLOGICAL FIELD

The present disclosure relates to electronic device packages, and more particularly, but not by way of limitation, to an integrated electronic module with a laminated bridge assembly.

BACKGROUND

Electronic device packages have experienced a continued trend of miniaturization and integration of complex functionality into compact form factors. For example, mobile consumer devices now integrate various radios, sensors, processors, memory modules, and other components into thin and lightweight integrated circuit packages. Emerging applications in wearable technology and the Internet-of-Things (IoT) generally involve integration of sophisticated electronics constrained by very small footprints. The automotive industry also continues to incorporate more electronics for advanced safety, efficiency, and comfort features.

However, increased integration and density of components has presented various challenges. Miniaturization involves reducing available area on printed circuit boards or other substrates for placing components. Simply reducing footprint sizes of components can negatively impact manufacturing cost, yield, and reliability.

SUMMARY

Three-dimensional integration techniques can make better utilization of available volume to provide enhanced density in electrical packaging. For example, three-dimensional integration can involve stacking components or substrates vertically to enhance density without requiring a greater footprint associated with an electronic device package. Three-dimensional integration of electronic device packages may include electrical interconnections between one or more of the layers or substrates in a stack. The present inventors have recognized, among other things, that providing reliable interconnections in three-dimensionally-integrated electronic packages may present difficulties. In an approach, interconnections may be inserted between a lower and upper layer of substrate and connected to the substrates to provide mechanical support or electrical connection. It may be difficult to precisely align or place structures providing such interconnections, which may result in one or more of poor yield, an expensive manufacturing process, or structural limitations, such as on a minimum spacing between layers or a minimum cross-sectional area of the interconnections. For example, it may be difficult to achieve planarity at interfaces where interconnections mate. In one approach, solder or other material can be used to fill gaps resulting from poor planarity or mating. However, such solder joints may present other challenges, such as poor reliability or being prone to flow across other areas, such as under components.

The present inventors have recognized, among other things, that providing inter-substrate or inter-layer interconnections (or both) using layers or substrates in a stack may help with one or more of these difficulties. As described herein, a laminated bridge assembly can include one or more interconnections to facilitate a stacked or three-dimensional integration of components within an integrated electronic device package. Use of the assembly or related techniques herein in an integrated electronic package can provide one or more of increased mechanical strength, improved electrical connection resilience, decreased electrical connection resistance, decreased noise of electrical connections, enhanced planarity between interconnections, increased ratio between interconnection height as compared to width, or decreased connection sizes, or combinations thereof.

In an example an integrated electronic module assembly may include a substrate comprising conductive regions on opposite surfaces of the substrate and a laminated bridge assembly. The laminated bridge assembly may include a dielectric material, the dielectric material forming a planar region and respective legs defining a cavity region, the respective legs including at least one respective inter-layer interconnection. The laminated bridge assembly may also include a conductive layer, the conductive layer defining at least one respective pad region electrically coupled to the at least one respective inter-layer interconnection. The laminated bridge assembly may be electrically and mechanically coupled to the substrate, the substrate including a first surface including a respective conductive region to which the at least one respective inter-layer interconnection is electrically coupled and an opposite second surface including respective conductive regions forming terminals of the integrated electronic module assembly.

In an example an integrated electronic module assembly may include a substrate comprising conductive regions on opposite surfaces of the substrate and a laminated bridge assembly. The laminated bridge assembly may include a dielectric material, the dielectric material forming a planar region and respective legs defining a cavity region, the respective legs including at least one respective inter-layer interconnection. The laminated bridge assembly may also include a conductive layer, the conductive layer defining at least one respective pad region electrically coupled to the at least one respective inter-layer interconnection. The laminated bridge assembly may be electrically and mechanically coupled to the substrate, where the integrated electronic module assembly provides a switching converter, where the laminated bridge assembly may be electrically and mechanically coupled to an inductor that acts as an energy storage device.

In an example, a method of manufacturing an integrated circuit module may include placing a laminated bridge assembly on a substrate. The laminated bridge assembly may include a dielectric material, the dielectric material forming a planar region and respective legs defining a cavity region, the respective legs including at least one respective inter-layer interconnection. The laminated bridge assembly may also include a conductive layer, the conductive layer defining at least one respective pad region electrically coupled to the at least one respective inter-layer interconnection. The method may also include coupling, electrically and mechanically, the laminated bridge assembly to the substrate, where the substrate includes a conductive region electrically coupled to the at least one respective inter-layer interconnection.

BRIEF DESCRIPTION OF THE DRAWINGS

In the drawings, which may not be drawn to scale, like numerals may describe substantially similar components throughout one or more of the views. Like numerals having different letter suffixes may represent different instances of substantially similar components. The drawings illustrate generally, by way of example but not by way of limitation.

DETAILED DESCRIPTION

Generally, the present subject matter can include structures and techniques involving stacking and connecting electronic components in a compact way. Such structures can include or use a laminated bridge assembly comprising layered dielectric and conductive materials. The laminated bridge assembly can be placed upon a substrate and can define an open cavity region where components can be placed. The legs of the laminated bridge can include vertical interconnections to conductively couple signals between layers. Pad regions can be included on the laminated bridge surface to allow components to be mounted and connected through the interconnections. Multiple assemblies can be vertically stacked by aligning the pad regions, creating a high-density three-dimensional package. A modular approach using a laminated bridge may help enable efficient use of vertical space to pack more components in a small footprint.

Figure 1:
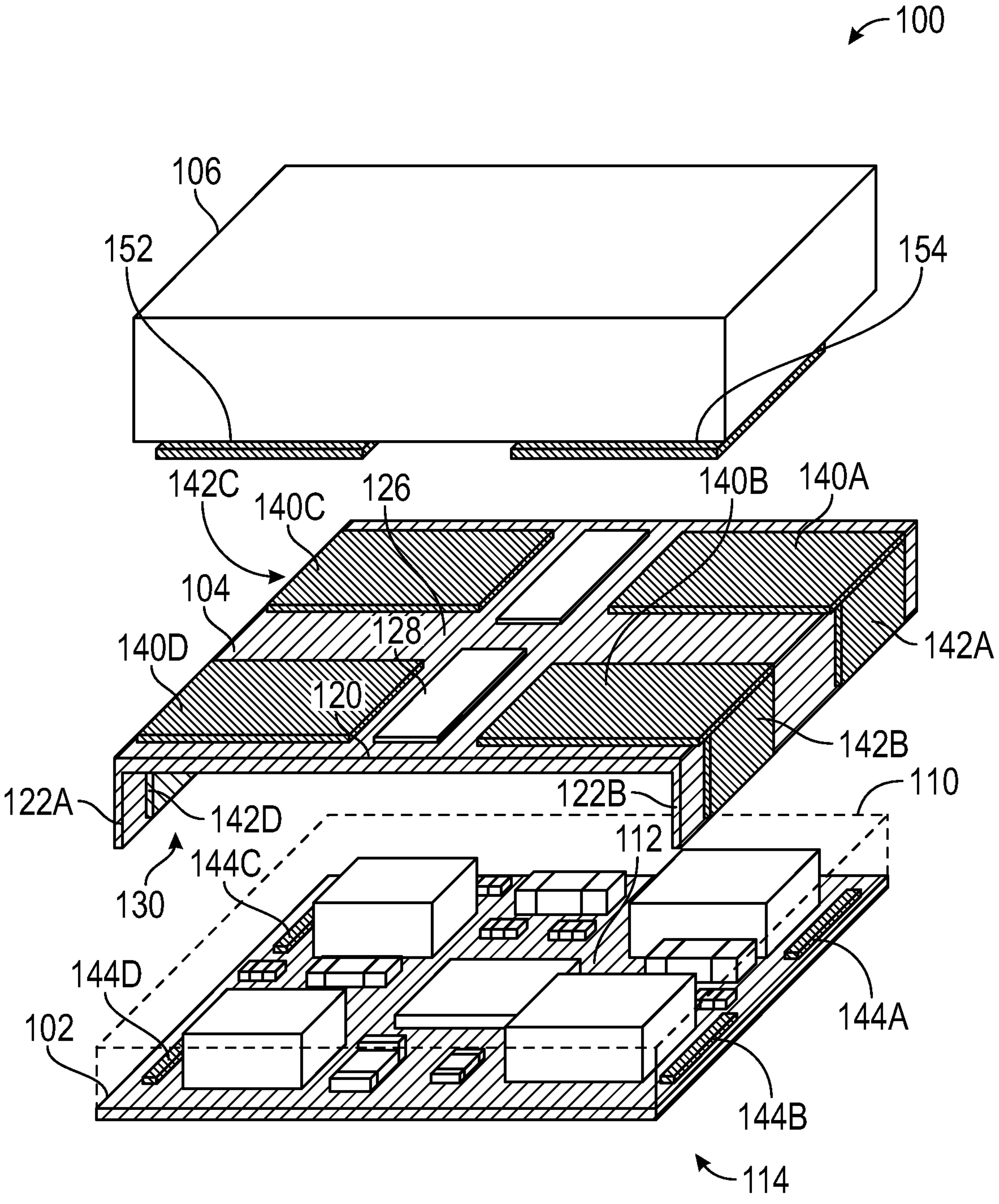
FIG. 1 is an exploded view of an example comprising an integrated electronic module assembly.

FIG. 1 is an exploded view of an example comprising an integrated electronic module assembly 100. In the example of FIG. 1, the integrated electronic module assembly 100 may include a substrate 102, a laminated bridge assembly 104, and a passive component 106.

The substrate 102 defines opposite sides, including a first surface 112 and a second surface 114. There may be one or more electronic components mounted (e.g., electrically and/or mechanically coupled to) on one or more of the first surface 112 or the second surface 114. In an example, there may be a plurality of components such as in a region 110 mounted on the first surface 112, or the second surface 114, or both. The plurality of components in the region 110 may be mounted to one or more conductive regions of one or more of the first surface 112, as shown in FIG. 1, or the second surface 114, or both.

The substrate 102 may include one or more of a ceramic substrate, a polymer material such as a glass-epoxy laminate (e.g., an FR-4 substrate), or another material (e.g., another material with one or more of insulating or dielectric properties). The conductive regions of the substrate 102 may include one or more of traces, pads, vias or other conductive elements for routing signals and/or power about the substrate 102.

The laminated bridge assembly 104 may include a planar region 126 and one or more respective legs, such as may include leg 122A and leg 122B. The planar region 126 and the legs may include a dielectric material 120. The dielectric material 120 may be generally continuous between the planar region 126 and the leg such as may include the planar region 126 and the one or more respective legs being mechanically connected through the dielectric material 120 or defined by the dielectric material 120. In an example, the dielectric material 120 comprising the planar region 126 and the one or more respective legs may be mechanically connected to each other, such using an adhesive or other mechanical bonding agent. The dielectric material 120 may include one or more of a polymer, resin (e.g., an FR-4 substrate), or ceramic. For example, the dielectric material 120 may include fiber reinforcement for increased strength.

The dielectric material 120 may define a cavity region 130. The cavity region 130 may be defined by the legs on one or more sides and the planar region 126 on the top. The cavity region 130 may provide space to fit one or more of the plurality of components in the region 110.

The laminated bridge assembly 104 may include one or more conductive pad regions, such as may include pad 140A, pad 140B, pad 140C, or pad 140D. The at least one respective pad region may be configured for electrical coupling to one or more components, such as may include the passive component 106. In an example, the at least one respective pad region may be on a top side (e.g., the side of the planar region 126 away from the substrate 102) of the planar region 126. In an example, the at least one respective pad region may be on a bottom side (e.g., the side of the planar region 126 close to the substrate 102) of the planar region 126. In an example, the at least one respective pad region may be positioned on both a top and bottom side of the planar region 126.

The laminated bridge assembly 104 may include one or more inter-layer interconnections, such as may include interconnection 142A, interconnection 142B, interconnection 142C, and interconnection 142D. The at least one inter-layer interconnection may be positioned in one or more of the legs. For example, the interconnection 142A and the interconnection 142B may be positioned in the leg 122B, and the interconnection 142C and the interconnection 142D may be positioned in the leg 122A. The at least one inter-layer interconnection may be constructed of one or more of a via structure (e.g., a cavity formed by removing a portion of the dielectric material 120, such as through mechanical machining or chemical etching) that has been filled and/or plated with a conductive material (e.g., copper) or a conductive slug (e.g. a piece of conductive material, such as may include copper, that has been positioned on or within the legs.

The at least one inter-layer interconnection may be electrically coupled to respective ones of the at least one respective pad region. For example, the interconnection 142A may be electrically coupled to the pad 140A, the interconnection 142B may be electrically coupled to the pad 140B, the interconnection 142C may be electrically coupled to the pad 140C, and the interconnection 142D may be electrically coupled to the pad 140D.

The integrated electronic module assembly 100 may include any number of interconnections, such as may include one interconnection, two interconnections, three interconnections, four interconnections, five or more interconnections, 10 or more interconnections, 50 or more interconnections 250 or more interconnections, or 1000 or more interconnections.

The laminated bridge assembly 104 may be electrically and/or mechanically coupled to the substrate 102. The laminated bridge assembly 104 may be mounted on the substrate 102 using one or more of solder, adhesive (e.g., electrically conductive adhesive, non-conductive adhesive, or both), etc. The substrate 102 may include at least one respective conductive region for coupling to the laminated bridge assembly 104, such as may include conductive region 144A, conductive region 144B, conductive region 144C, and conductive region 144D. The interconnection 142A may be electrically coupled to the conductive region 144A, the interconnection 142B may be electrically coupled to the conductive region 144B, the interconnection 142C may be electrically coupled to the conductive region 144C, and the interconnection 142D may be electrically coupled to the conductive region 144D. The at least one respective conductive region may be configured to align with a portion of respective ones of the at least one inter-layer interconnection that is positioned towards the substrate 102 (e.g., at the bottom of the legs).

The at least one respective conductive region may be electrically coupled to one or more components on the substrate 102. The at least one respective conductive region may be coupled to one or more terminals on the substrate 102, such as may allow for coupling to one or more other packages and/or devices.

In an example, the electrical coupling (e.g., through solder, conductive adhesive, etc.) between the substrate 102 and the laminated bridge assembly 104 may also provide some or all of the mechanical coupling between the substrate 102 and the laminated bridge assembly 104. For example, the solder electrically connecting the at least one respective conductive region to the at least one inter-layer interconnection may also mechanically couple the substrate 102 to the laminated bridge assembly 104. In an example, additional bonding agents or methods (e.g., adhesive, heat-induced bonding, etc.) may be used to couple the substrate 102 to the laminated bridge assembly 104.

The dielectric material 120 may include one or more apertures 128, such as may allow for an encapsulant and/or coating (e.g., an overmolding material, a conformal coating, etc.) to penetrate the cavity region 130. One or more portions of the integrated electronic module assembly 100 may include an encapsulant or a coating, such as may include the cavity region 130. The encapsulant may provide one or more of increased mechanical and/or electrical integrity of the integrated electronic module assembly 100, increased and/or more even heat dissipation for the integrated electronic module assembly 100, water resistance, etc.

The passive component 106 may include, for example, a capacitor, resistor, or inductor. In an example, there may be multiple passive components mounted on the laminated bridge assembly 104. The passive components may all be of one type, or the passive components may be of different type (e.g., one or more inductors and one or more capacitors). In an example, there may be one or more non-passive components (e.g., an active component, such as a transistor or an integrated circuit (IC), etc.) mounted on the laminated bridge assembly 104 alternative or in addition to the one or more passive components. The passive component 106 may be mounted on the laminated bridge assembly 104 and may be electrically coupled to at least one respective pad region. The passive component 106 may be coupled to the substrate 102 through the laminated bridge assembly 104, such as may include coupling through the at least one respective pad region, at least one inter-layer interconnection, and at least one respective conductive region.

In an example, the passive component 106 may include a first terminal 152 and a second terminal 154. The first terminal 152 may be coupled to one or more of the pad 140A or the pad 140B. The second terminal 154 may be coupled to one or more of the pad 140C or the pad 140D. The use of more than one pad region for coupling to a single terminal of the passive component 106 may one or more of increase current capacity or decrease heat concentration as specific locations of the substrate 102 and/or the laminated bridge assembly 104.

In an example, the integrated electronic module assembly 100 may include a switching converter (e.g., an alternating current (AC)-to-direct-current (DC) converter, a DC-to-AC converter, a DC-to-DC converter (e.g., a buck converter, a boost converter, or a buck-boost converter)). The passive component 106 may act as an energy storage device for the switching converter. For example, the passive component 106 may include an inductor that acts as an energy storage inductor for the switching converter.

Figure 2A:
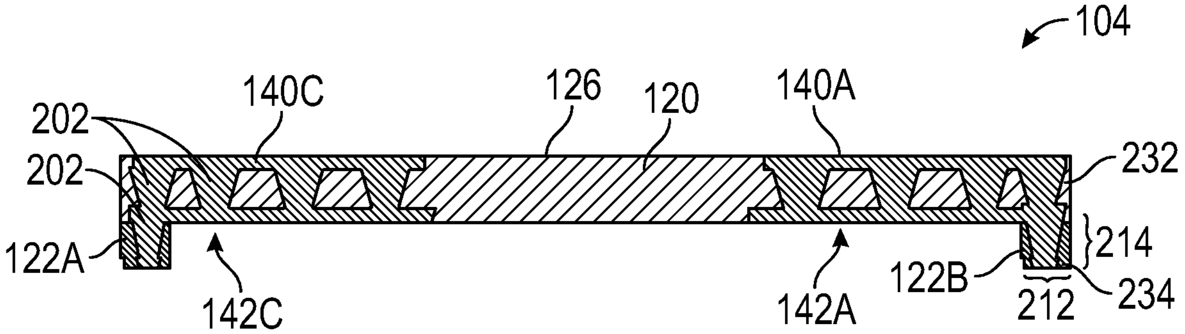
FIG. 2A is a section view of an illustrative example comprising a laminated bridge assembly.

FIG. 2A is a section view drawing of the illustrative example comprising the laminated bridge assembly. In the example of FIG. 2A, the laminated bridge assembly 104 includes two pad regions, pad 140A and pad 140C. FIG. 2A show that the laminated bridge assembly 104 may be constructed of one or more layers of dielectric material. The one or more layers of dielectric material may include a first layer 232 and a second layer 234. The first layer may be positioned on top of the second layer, and may be mechanically bonded to the first layer, such as using an adhesive. The one or more layers may include one or more conductive components such as may include one or more traces, one or more pads, one or more slugs, or one or more filled and/or plated vias 202. There may be a conductive component or components forming the pad 140A and another conductive component or components forming the pad 140C. One or more conductive components may form the interconnection 142A. One or more conductive components may form the interconnection 142C. In an example, the interconnection 142A and the interconnection 142C may be at least partially formed by vias 202.

The interconnection 142A may include one or more vias 202 on the first layer 232 electrically coupled to one or more vias 202 on the second layer 234. In this way, the interconnection 142A may span both of the layers 232 and 234 and connect the pad 140A to the portion of the interconnection 142A in the bottom of the leg 122B.

The interconnection 142C may include one or more vias 202 on the first layer 232 electrically coupled to one or more vias 202 on the second layer 234. In this way, the interconnection 142C may span both of the layers 232 and 234 and connect the pad 140C to the portion of the interconnection 142C in the bottom of the leg 122A.

The vias 202 may be one or more of round vias, oval vias (e.g., longer in one dimension than another), bar vias, etc. The vias 202 may all be configured the same or one or more of the vias 202 may be configured differently from one or more of the other vias 202.

Each of the legs may include a portion that is dielectric material 120 and a portion that includes conductive components. In an example, one or more of the dielectric material 120 or the conductive components may provide mechanical structure to the legs and/or the laminated bridge assembly 104. In an example, a combined effect of the dielectric material 120 and the conductive components in the legs and/or the planar region 126 may provide structure to the legs and/or the laminated bridge assembly 104.

Each of the legs may have a width 212 and a height 214. Each of the legs may have the same width 212 and height 214, or the legs may differ in one or more ways (e.g., different height, different width, etc.). The ratio of the height 214 of the legs to a width 212 of the legs may affect one or more of how high the planar region 126 is above the substrate 102, or how wide the substrate 102 must be to accommodate the laminated bridge assembly 104. In an example, the ratio of the height of one or more of the legs to the respective width of the legs may meet or exceed 1:1, 2:1, 3:1, 4:1, 5:1, 6:1, 8:1, or 10:1. The legs may also have a length, which may have a greater magnitude than the width 212. In an example, the width 212 may be defined as the smaller of the width 212 and the length of the leg (e.g., the narrowest dimension of the leg orthogonal to the height 214).

Figure 2B:
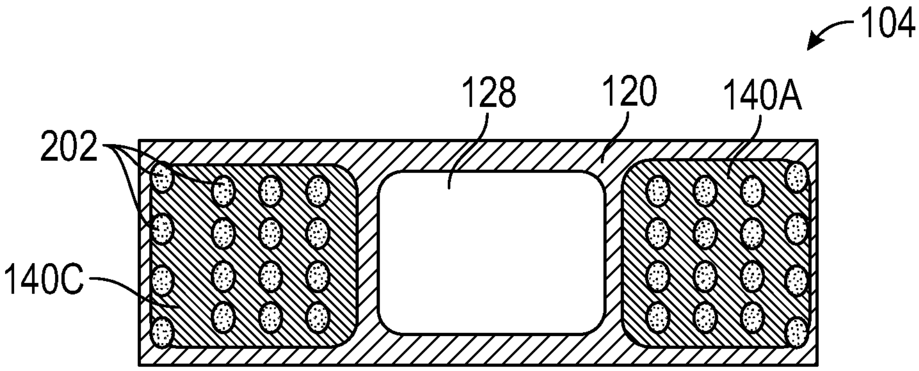
FIG. 2B is a top view of the illustrative example comprising the laminated bridge assembly of FIG. 2A.

FIG. 2B is a top view drawing of the illustrative example comprising the laminated bridge assembly 104 of FIG. 2A. FIG. 2B shows that the at least one respective pad region may be constructed by plating over one or more vias 202. The at least one respective pad region may be sized and shaped to interface with one or more components, such as the passive component 106. An area of the at least one respective pad region may be selected to help reduce a resistance in the connection between the at least one respective pad region and the connected components (e.g., a larger area may be selected if space allows.)

FIG. 2A and FIG. 2B show that the at least one inter-layer interconnection may be configured to manage an electrical resistance (e.g., reducing the interconnect resistance), such as by increasing a cross-sectional area of the at least one inter-layer interconnection. For example, the first layer 232 may include a 2-dimensional arrangement of vias 202 (e.g., multiple rows and columns of vias 202, at least 3 vias 202 across a 2-dimensional area, etc.) to increase a cross-sectional area of conductive material comprising the at least one inter-layer interconnection in the first layer 232. The second layer 234 may include a 1-dimensional arrangement of vias 202 (e.g., at least 2 vias 202 in an approximate line along a length of the leg) to increase a cross-sectional area of the at least one inter-layer interconnection in the second layer 234. In an example, the second layer 234 may include a 2-dimensional arrangement of vias 202.

Figure 2C:
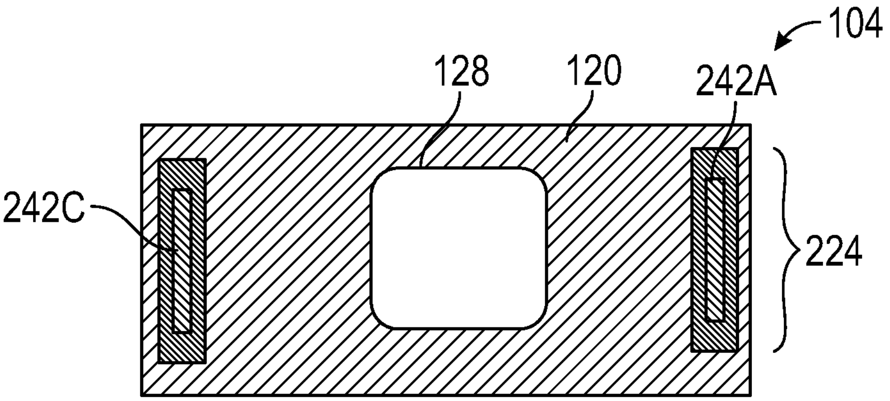
FIG. 2C is a bottom view of the illustrative example comprising the laminated bridge assembly of FIG. 2A.

FIG. 2C is a bottom view drawing of the illustrative example comprising the laminated bridge assembly of FIG. 2A. In the example of FIG. 2C, a bottom portion of the interconnection 142A may be plated to produce a corresponding conductive region 242A which may be configured to be coupled to conductive region 144A. A bottom portion of the interconnection 142C may be plated to produce a corresponding conductive region 242C which may be configured to be coupled to conductive region 144C.

FIG. 2C shows that the at least one corresponding conductive regions and/or the at least one inter-layer interconnection can include structures other than circular via structures. For example, a conductive region can define a rectangular strip, such as defined by a length 224. The length 224 of a given inter-layer interconnection may be selected to provide one or more of a specified resistance, a specified heat dissipation, or a specified current carrying capacity. In an example, a length of a power node inter-layer interconnection may be larger than a length of a control node inter-layer interconnection. In an example, the length of the power node inter-layer interconnection may exceed the length of the control node connection by 50 percent, 100 percent, 200 percent, 300 percent, 400 percent, 600 percent, or 800 percent. In an example, a current carrying capacity of a power node inter-layer interconnection may be larger than a length of a control node inter-layer interconnection.

In an example, the laminated bridge assembly 104 may include only a single layer of dielectric, or the laminated bridge assembly 104 may include more than two layers of dielectric. For example, the laminated bridge assembly 104 may include three layers, four layers, five layers, six layers, seven layers, or eight or more layers. The layers may be distributed between the planar region 126 and the legs in any fashion, such as may include all layers except for one in the legs, all layers except for two in the legs, etc.

Figure 3A:
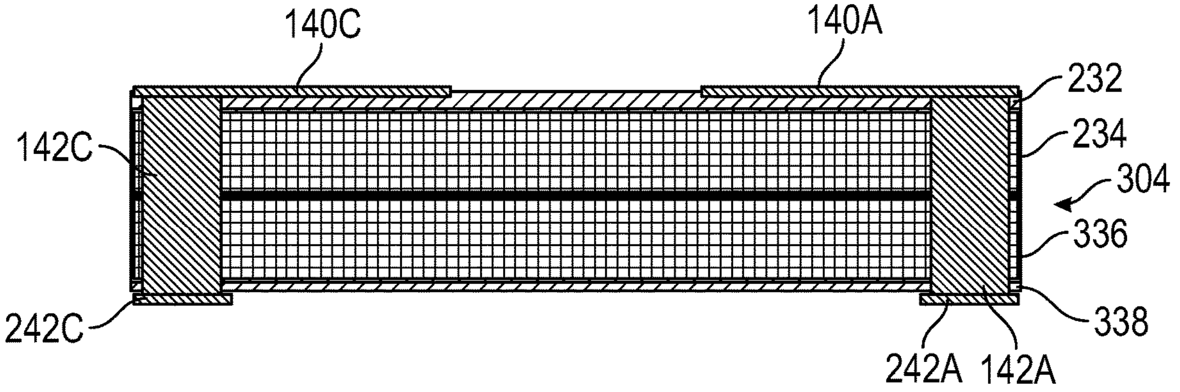
FIG. 3A is a section view of an illustrative example comprising a laminated bridge assembly.
Figure 3B:
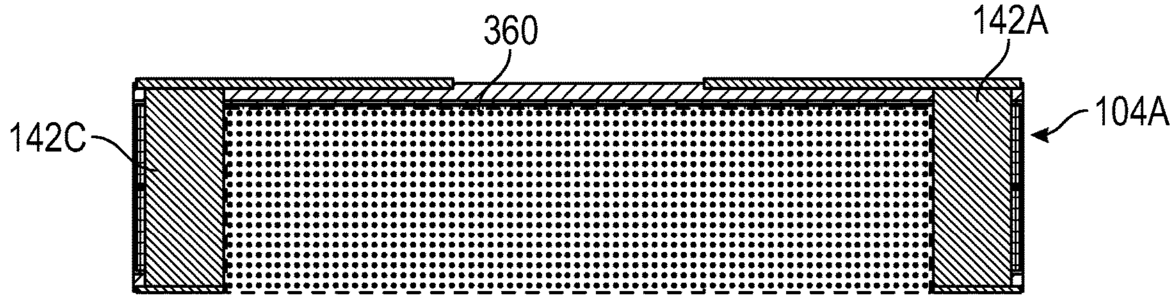
FIG. 3B is a section view of the illustrative example comprising the laminated bridge assembly of FIG. 3A.
Figure 3C:
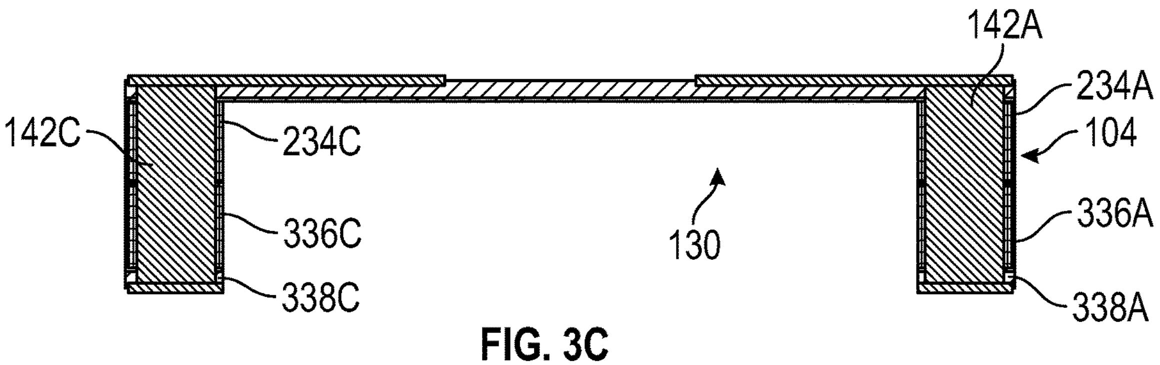
FIG. 3C is a section view of the illustrative example comprising the laminated bridge assembly of FIG. 3A.

FIG. 3A through FIG. 3C show a potential series of operations in the process of manufacturing a laminated bridge assembly 104.

FIG. 3A is a section view drawing of an example comprising a laminated bridge assembly intermediate 304. The intermediate 304 can be fabricated such as using techniques and materials similar to printed circuit board (PCB) fabrication, where one or more dielectric layers (e.g., glass-epoxy or other core or prepreg layers) are stacked and cured, with conductive metallization to provide conductive regions. For example, FIG. 3A shows that the laminated bridge assembly intermediate 304 may include a first layer 232, a second layer 234, a third layer 336, and a fourth layer 338. The first layer 232 and the fourth layer 338 may be thinner layers (e.g., prepreg layers) that can be clad with a conductor and can be overplated, while the second layer 234 and the third layer 336 may be thicker core layers filling space between the first layer 232 and the fourth layer 338 and providing structural support. In the example of FIG. 3A, the at least one inter-layer interconnection may be constructed using solid copper slugs. The at least one inter-layer interconnection may also include other conductive features, such as vias, alternatively or in addition to the copper slugs. The at least one respective pad region and the at least one corresponding conductive regions may be electrically connected to respective ones of the solid copper slugs.

FIG. 3A shows that the laminated bridge assembly intermediate 304 may be manufactured with the dielectric layers having a uniform footprint across the entire assembly such that the dielectric material 120 does not include a cavity region 130 initially. In another example, the dielectric material 120 may form a cavity region, but it may not match the size and/or shape of the final cavity region 130. The laminated bridge assembly intermediate 304 may be manufactured at least in part using a layered manufacturing process. For example, one or more layers including one or more of one or more traces, one or more pads, one or more vias, etc. may be placed onto another layer featuring one or more of one or more traces, one or more pads, one or more vias. Between the placement of one or more layers and/or following the placement of all layers, one or more vias may be filled or plated and/or other electrical connections between layers may be made. Conductive slugs may be inserted at any point in the manufacturing process. The construction process of the pad 140A may share one or more similarities with a printed circuit board manufacturing process.

FIG. 3B is a section view drawing of an example comprising a laminated bridge assembly intermediate 304 of FIG. 3A. FIG. 3B shows a portion 360 of the dielectric material 120 that may be removed from the laminated bridge assembly intermediate 304 during a portion of the manufacturing process. The removal of the portion 360 of the dielectric material 120 may result in the dielectric material 120 defining the cavity region 130. The portion 360 may be removed through mechanical machining (e.g., milling, drilling, cutting, etc), chemical etching, laser ablation, water cutting, etc. A tradeoff may exist where a volume of the portion 360 is inversely related to a rigidity of the finished laminated bridge assembly 104. Accordingly, wider legs defined by the dielectric material 120 result in a smaller cavity region 130, but with greater rigidity due to more dielectric material remaining in each leg, such as surrounding a respective inter-layer interconnection in the leg. The respective legs may be formed by removing dielectric material between the respective legs.

FIG. 3C is a section view drawing of an example comprising a laminated bridge assembly 104 derived from the laminated bridge assembly intermediate 304 of FIG. 3A. FIG. 3C shows that the portion 360 has been removed and the dielectric material of layers 234, 336, and 338 defines the cavity region 130. FIG. 3C shows that a portion of one or more of the dielectric layers may remain following the removal of dielectric material. This portion of dielectric material may include material that surrounds the legs of the laminated bridge assembly 104. For example, a first portion 234A of the second layer 234 may surround the interconnection 142A and a second portion 234C of the second layer 234 may surround the interconnection 142C. A first portion 336A of the third layer 336 may surround the interconnection 142A and a second portion 336C of the third layer 336 may surround the interconnection 142C. A first portion 338A of the fourth layer 338 may surround the interconnection 142A and a second portion 338C of the fourth layer 338 may surround the interconnection 142C.

The portion of the dielectric material that remains in the legs may provide structural support for the legs, such as may help maintain planarity of the legs. The portion of the dielectric material that remains on the legs may contact one or more of the inter-layer interconnections on one or more sides, such as may include completely surrounding one or more inter-layer interconnections.

In an example, all of the material from one or more layers may be removed. For example, all of the material from one or more of the second layer 234, the third layer 336, or the fourth layer 338 may be removed. The remaining inter-layer interconnections may support the first layer 232 and provide structure to the laminated bridge assembly 104. In this example, the second layer 234, the third layer 336, and the fourth layer 338 may provide one or more of structural support or a mold form for manufacturing the inter-layer interconnections, but once the inter-layer interconnections are manufactured, the inter-layer interconnections alone may be strong enough to support the laminated bridge assembly 104.

In an example, the cavity region 130 may be defined by the dielectric material of the layers without material removal following the assembly of two or more layers. For example, the laminated bridge assembly intermediate 304 may comprise the laminated bridge assembly 104. For example, the dielectric material of the layers may be manufactured to define respective portions of the cavity region 130 corresponding to that layer, such as through machining or initial formation of the dielectric layer. One or more combinations of the above methods may be employed. For example, one or more layers may define a portion of the cavity region 130 prior to machining the laminated bridge assembly intermediate 304. One or more steps may be conducted after the removal of the portion 360. For example, a layer may be added and/or a region may be plated.

Figure 4:
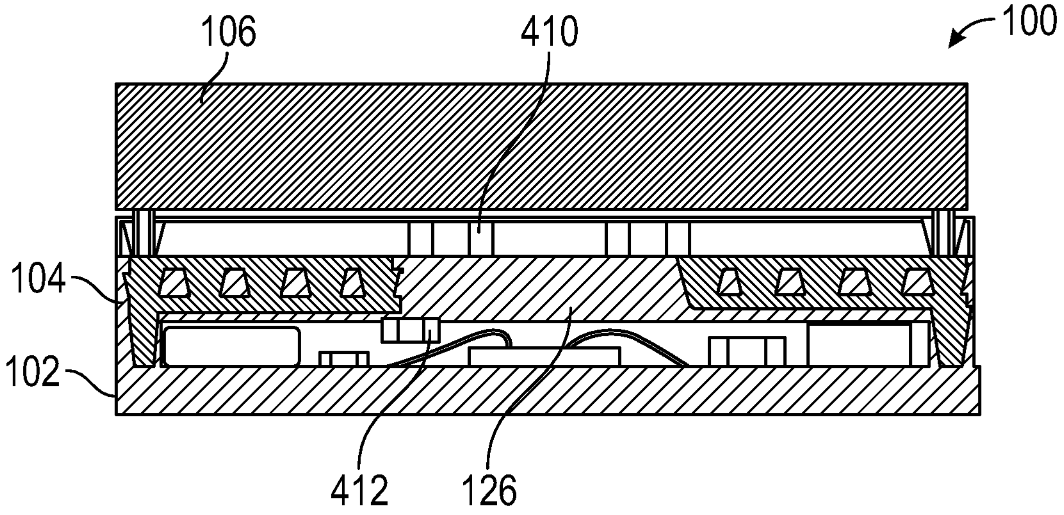
FIG. 4 is a section view of an illustrative example comprising an integrated electronic module assembly.

FIG. 4 is a section view of an illustrative example comprising an integrated electronic module assembly 100. In the example of FIG. 4, the laminated bridge assembly 104 includes respective conductive regions for electrical interconnections to electrical components on opposite surfaces of the planar region 126. A passive component 106 may be coupled on a first surface of the planar region 126 opposite the cavity region 130. A component 412 may be coupled on a second surface of the planar region 126 inside the cavity region 130. There may be one or more additional components on one or more of the first surface or the second surface. FIG. 4 also shows that there may be one or more components 410 mounted between the passive component 106 and the planar region 126, such as may be coupled to the first surface of the laminated bridge assembly 104.

Figure 5:
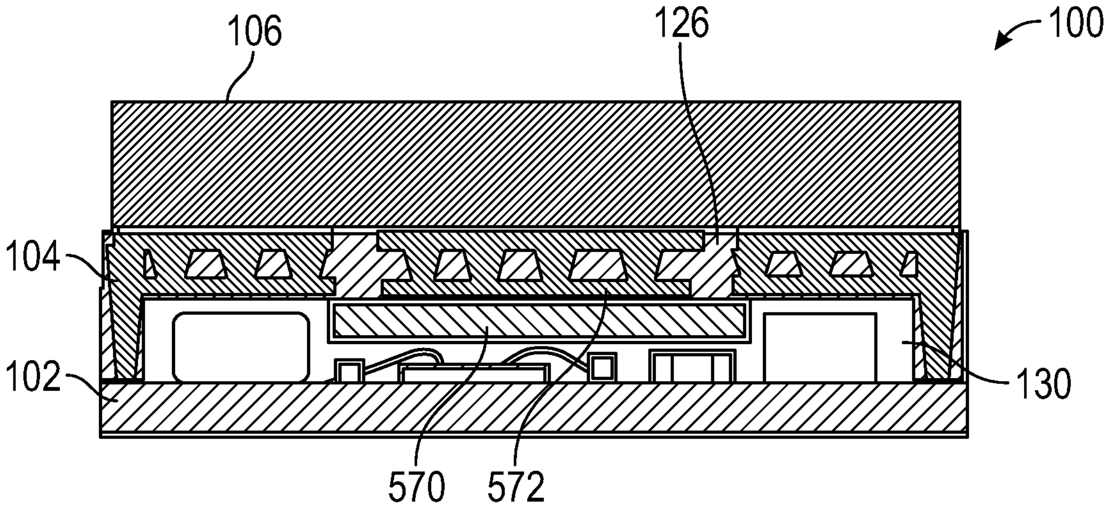
FIG. 5 is a section view of an illustrative example comprising an integrated electronic module assembly.

FIG. 5 is a section view of an illustrative example comprising an integrated electronic module assembly 100. In the example of FIG. 5, there may be a metallic slug 570 attached to a surface of the laminated bridge assembly 104 in the cavity region 130. The metallic slug 570 may be configured to one or more of spread or dissipate heat, such as may include heat from one or more of the passive component 106, the plurality of components in region 110, or another component in and/or near the integrated electronic module assembly 100. The metallic slug 570 may be manufactured of copper, aluminum, or another metal. In an example, the metallic slug 570 may be replaced by a non-metallic heat conducting material, such as a graphite, graphene, or a ceramic. In an example, the metallic slug 570 may be sized and shaped to fit around one or more components mounted on the substrate 102 and/or the laminated bridge assembly 104. In an example, the 570 may be embedded or partially embedded into the laminated bridge assembly 104, such as may include embedding the metallic slug 570 within the planar region 126 (e.g., removing a portion of the planar region 126 and placing the metallic slug 570 in the removed portion).

In an example, the laminated bridge assembly 104 may include a metallic region 572 that is not electrically coupled to another component. The metallic region 572 may be configured to one or more of spread or dissipate heat, such as may include heat from one or more of the passive component 106, the plurality of components in region 110, or another component in and/or near the integrated electronic module assembly 100. The metallic region 572 may be used in addition to or alternatively to the metallic slug 570. The metallic region 572 may be placed near the center of the planar region 126, and may be constructed of one or more of slugs, filled and/or plated vias, or plated regions. The metallic region 572 may be placed near the metallic slug 570, such as may help to conduct heat between the passive component 106 and the cavity region 130. In an example, the metallic region 572 may be electrically coupled to the metallic slug 570, such as may improve heat conduction between the metallic slug 570 and the metallic region 572.

Figure 6:
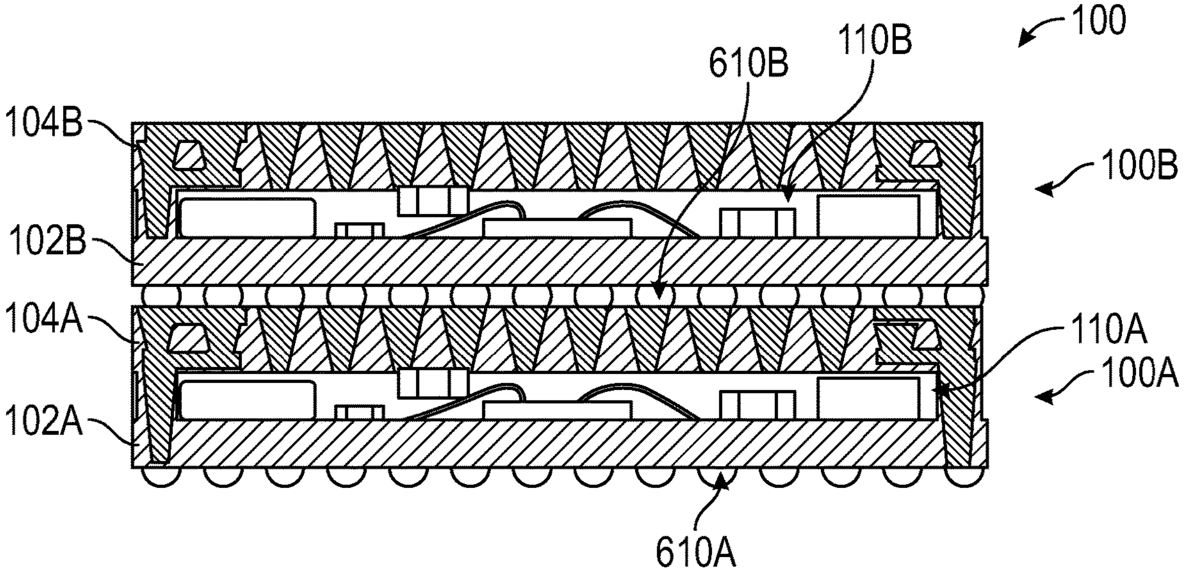
FIG. 6 is a section view of an illustrative example comprising an integrated electronic module assembly.

FIG. 6 is a section view of an illustrative example comprising an integrated electronic module assembly 100. FIG. 6 shows that the integrated electronic module assembly 100 may include a first substrate 102A, a first laminated bridge assembly 104A, a second substrate 102B, and a second laminated bridge assembly 104B, illustrating generally a "stackable" or modular configuration. The first substrate 102A and the second substrate 102B may be configured similarly to the substrate 102 described above, or one or both may differ in one or more ways. The first laminated bridge assembly 104A and the second laminated bridge assembly 104B may be configured similarly to the laminated bridge assembly 104 described above, or one or both may differ in one or more ways. FIG. 6 shows that the first laminated bridge assembly 104A may be configured to receive the second substrate 102B. The second substrate 102B may be mounted on the first laminated bridge assembly 104A, such as through a plurality of solder bumps 610B. The first substrate 102A may also include a plurality of solder bumps 610A for mounting the integrated electronic module assembly 100 on another chip.

A modular integrated electronic module assembly 100 may allow user to adjust or scale the one or more capabilities of a system (e.g., output rating, processing power), such as by adding additional stacked modules. This may allow for adjusting or scaling capabilities without requiring a newly designed or manufactured chip.

The first substrate 102A and the first laminated bridge assembly 104A may form a first integrated module assembly 100A. The second substrate 102B and the second laminated bridge assembly 104B may form a second integrated module assembly 100B. A configuration of the pad regions on the first integrated module assembly 100A may be configured to allow for stacking of the second integrated module assembly 100B on the first integrated module assembly 100A. Together, the first integrated module assembly 100A and the second integrated module assembly 100B may form the integrated electronic module assembly 100. In an example, the second integrated module assembly 100B may also have a configuration of pad regions that allow for stacking an additional integrated module assembly on the second integrated module assembly 100B. In an example, the stack may include three integrated electronic module assemblies, four integrated electronic module assemblies, five integrated electronic module assemblies, or six or more integrated electronic module assemblies. The integrated electronic module assembly 100, including two or more integrated module assemblies, may all connect outside of the integrated electronic module assembly 100 only through the plurality of solder bumps 610A.

The first integrated module assembly 100A may include a first plurality of components in region 110A. The second integrated module assembly 100B may include a second plurality of circuit components in region 110B. The first plurality of components in region 110A may be mounted on one or more of the first substrate 102A or the first laminated bridge assembly 104A. The second plurality of circuit components in region 110B may be mounted on one or more of the second substrate 102B or the second laminated bridge assembly 104B.

In an example, the second substrate 102B may be omitted and the second laminated bridge assembly 104B may be configured to mount directly on the first laminated bridge assembly 104A. The first laminated bridge assembly 104A may include a configuration of pad regions to allow for stacking the second laminated bridge assembly 104B on the first laminated bridge assembly 104A. The first laminated bridge assembly 104A may provide electrical and mechanical interconnection between the second laminated bridge assembly 104B and the first substrate 102A. In an example, the second laminated bridge assembly 104B may also have a configuration of pad regions that allow for stacking an additional laminated bridge assembly on the second laminated bridge assembly 104B. In an example, the stack may include three laminated bridge assemblies, four laminated bridge assemblies, five laminated bridge assemblies, or six or more laminated bridge assemblies.

In an example, the integrated electronic module assembly 100 may include two or more substrates and two or more laminated bridge assemblies, but each bridge assembly may not have a corresponding substrate. For example, the stack forming the integrated electronic module assembly 100 could include two bridge assemblies between substrates, or the stack could end with two bridge assemblies with no intervening substrate.

Figure 7:
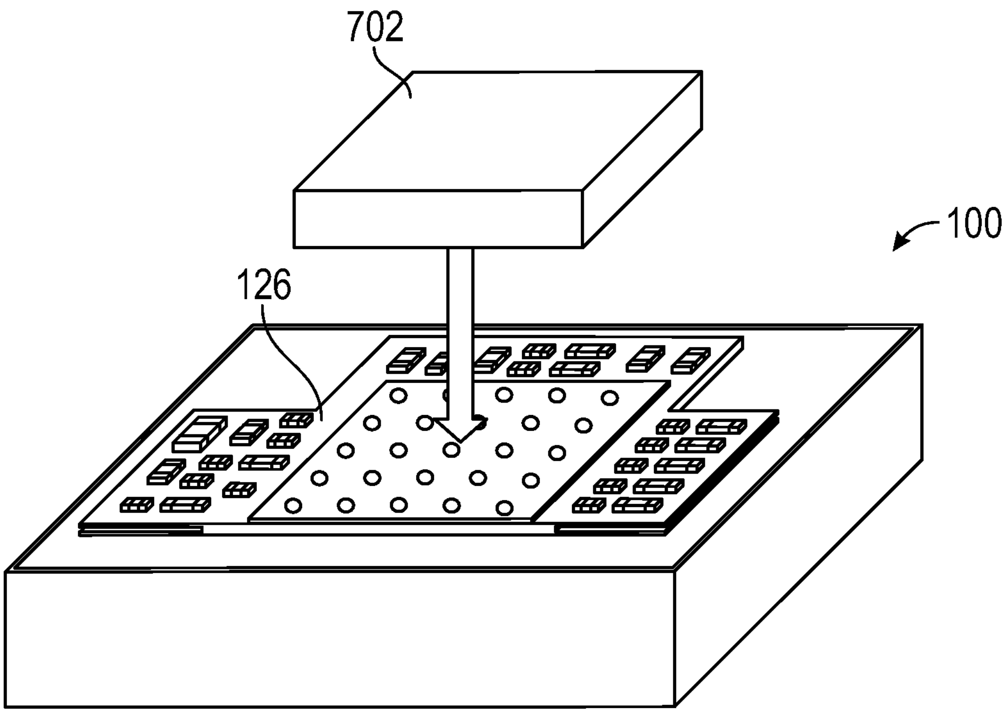
FIG. 7 is a perspective view of an illustrative example comprising an integrated electronic module assembly and an environment in which the integrated electronic module assembly may be used.

FIG. 7 is a perspective view of an illustrative example comprising an integrated electronic module assembly 100 and an environment in which the integrated electronic assembly module may be used. In the example of FIG. 7, the integrated electronic module assembly 100 has been one or more of overmolded or encased to form a package, and the substrate 102 is not shown. FIG. 7 shows that the integrated electronic module assembly 100 may be configured to receive an integrated circuit chip 702 (e.g., a chip-scale package or other integrated circuit package) on a surface of the substrate opposite the cavity region 130. The integrated circuit chip 702 may be a chip that is optionally installed after the integrated electronic module assembly 100 has left a manufacturing facility. For example, the integrated circuit chip 702 could be an optional chip that is used to upgrade the integrated electronic module assembly 100. In an example, the integrated electronic module assembly 100 is a multi-purpose device, and the integrated circuit chip 702 is selected to achieve a desired function of the combined integrated electronic module assembly 100 and integrated circuit chip 702 assembly.

In an example, the integrated circuit chip 702 may include one or more discrete components (e.g., resistors, capacitors, transistors, etc.) alternatively or in addition to an integrated circuit component. For example, the integrated circuit chip 702 may include an substrate upon which one or more integrated circuit chips and one or more discrete components are mounted. The integrated circuit chip 702 may be a standalone module that can function separate from the integrated electronic module assembly 100 or together with the integrated electronic module assembly 100.

In an example, the integrated electronic module assembly 100 may include an integrated circuit chip electrically and mechanically coupled to respective conductive regions of the laminated bridge assembly 104 on a surface of the laminated bridge assembly 104 inside the cavity region 130.

Figure 8:
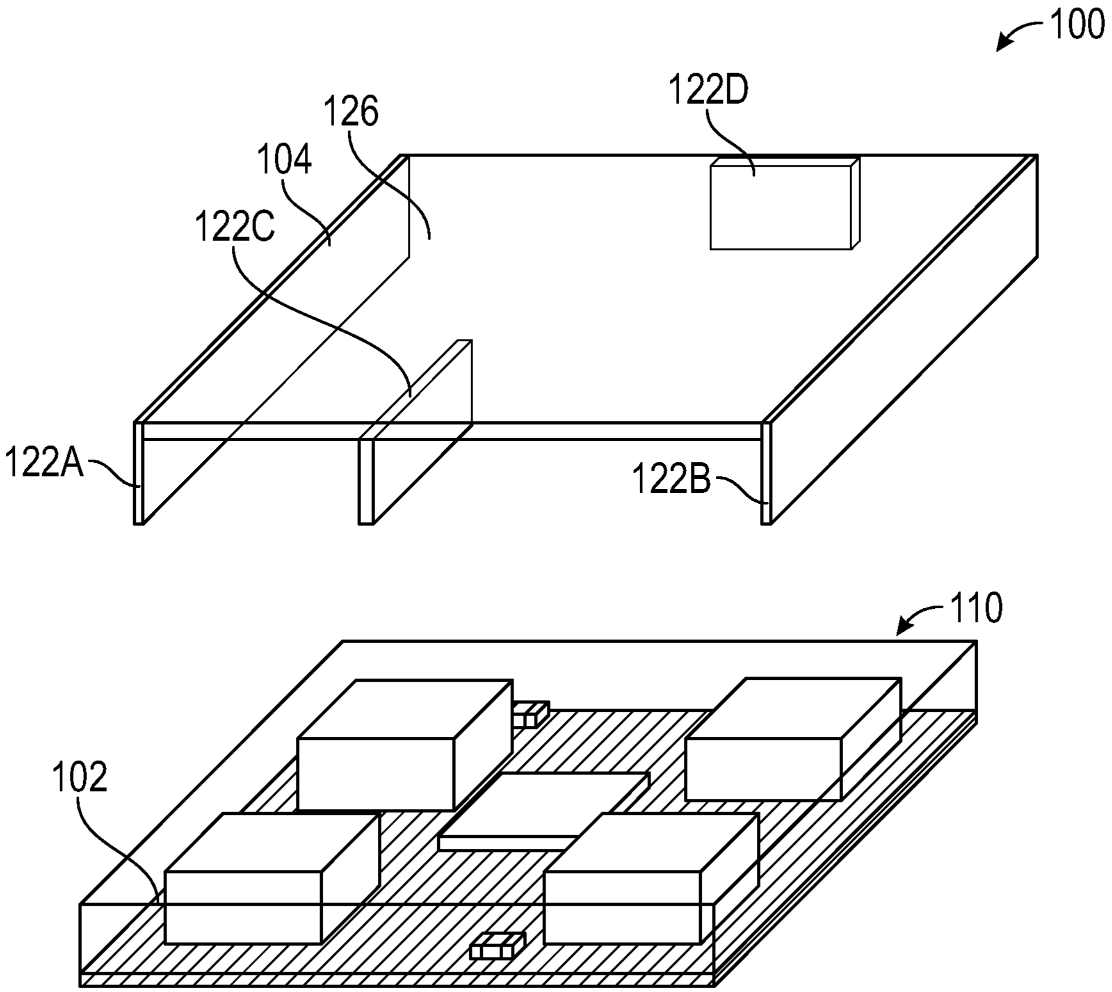
FIG. 8 is an exploded view of an example comprising an integrated electronic module assembly.

FIG. 8 is an exploded perspective view of an example comprising an integrated electronic module assembly 100. FIG. 8 shows that there may be a leg 122C and a leg 122D. The legs may not be required to be one or more of parallel to one or more of the other legs, arranged on a perimeter of the planar region 126, or extend across the entire planar region 126. For example, leg 122D is not parallel to legs 122A and 122B. Leg 122C is not arranged on the perimeter of the planar region 126. Legs 122C and 122D do not cover the entire length of the planar region 126.

One or more of the legs may not include an inter-layer interconnection, and may only be used for one or more of mechanical support or heat dissipation. One or more of the legs may be positioned, sized, and shaped to fit around one or more of the plurality of components in region 110. In an example, a leg may include a bend and/or a curve. There may be any number of legs, such as may include one leg, two legs, three legs, four legs, five legs, or six or more legs.

In an example, two or more legs may be configured to include electrical components electrically and mechanically coupled between the legs. For example, a bank of one or more of input or output capacitors may be positioned horizontally between two appropriately spaced legs. The capacitors may connect to a single terminal on either side, which may result in an effective capacitance equal to the sum of all the capacitor values coupled between the two legs.

In an example, the integrated electronic module assembly 100 may be configured differently. For example, one or more of the legs may be on the substrate 102. One or more of the at least one inter-layer interconnection may be included in legs on the substrate 102. In an example, all of the legs are on the substrate 102, and the laminated bridge assembly 104 is a flat dielectric material 120. In this example, the dielectric of the substrate 102 may define the cavity region 130. The substrate 102 with legs may be manufactured similarly to the laminated bridge assembly 104 described above, or may differ in one or more ways.

Figure 9:
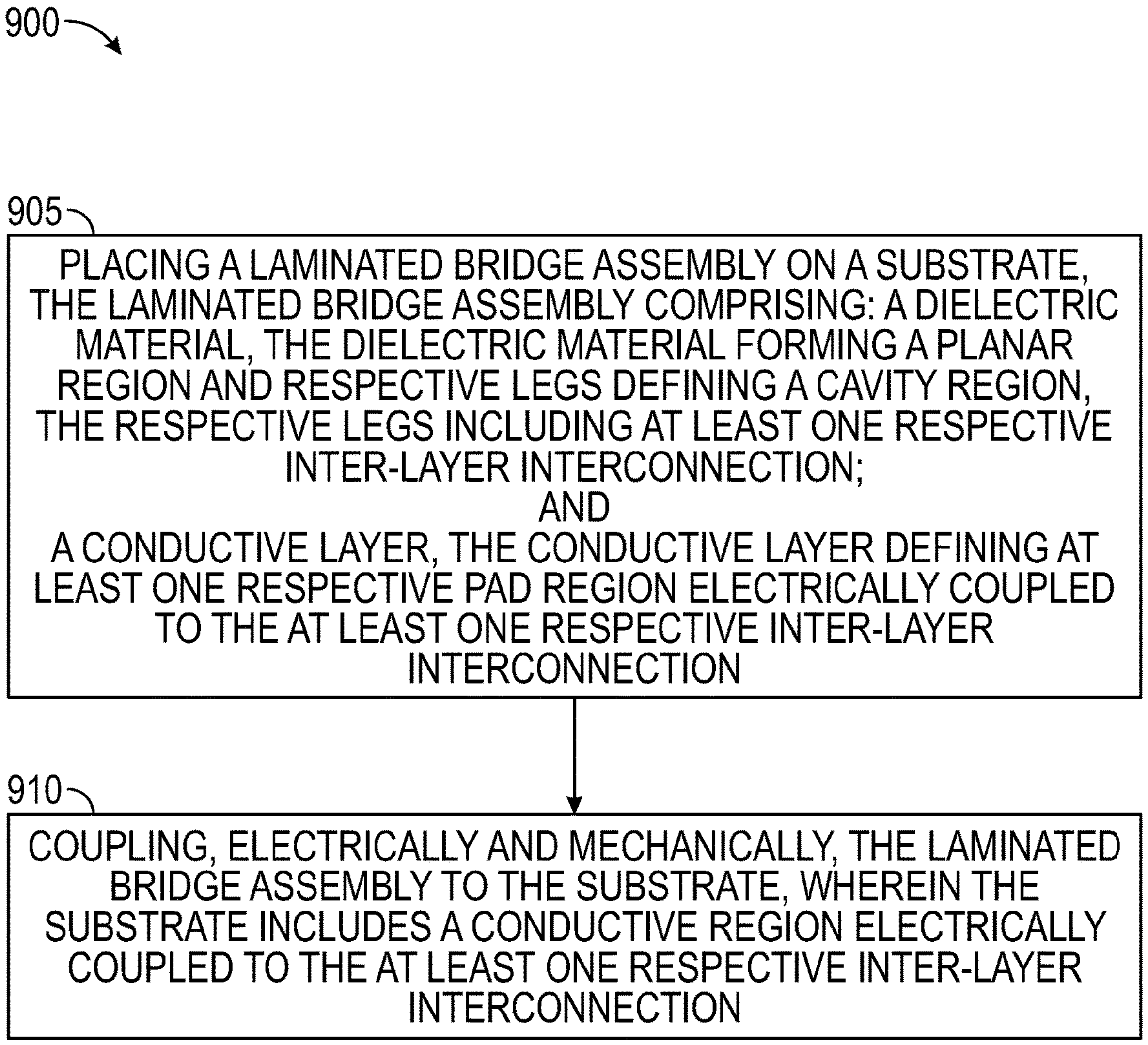
FIG. 9 is a diagram showing an example of a method for manufacturing an integrated electronic module assembly.

FIG. 9 is a diagram showing an example of a method 900 for manufacturing portions of an integrated electronic module assembly. At 905, a laminated bridge assembly can be placed on a substrate. The laminated bridge assembly may include a dielectric material, the dielectric material may form a planar region and respective legs defining a cavity region, the respective legs may include at least one respective inter-layer interconnection. The laminated bridge assembly may include a conductive layer, the conductive layer may define at least one respective pad region electrically coupled to the at least one respective inter-layer interconnection. At 910, the laminated bridge assembly may be coupled, electrically and mechanically, to the substrate, wherein the substrate may include a conductive region electrically coupled to the at least one respective inter-layer interconnection. The shown order of steps is not intended to be a limitation on the order the steps are performed in. In an example, two or more steps may be performed simultaneously or at least partially concurrently.

At step 905, the laminated bridge assembly may be the laminated bridge assembly 104 and the substrate may be the substrate 102. In an example, the method 900 may also include placing a passive component, such as the passive component 106, on the planar region. The method 900 may also include coupling, electrically and mechanically, the passive component to the planar region, such as may include coupling the passive component to the at least one respective pad region.

Figure 10:
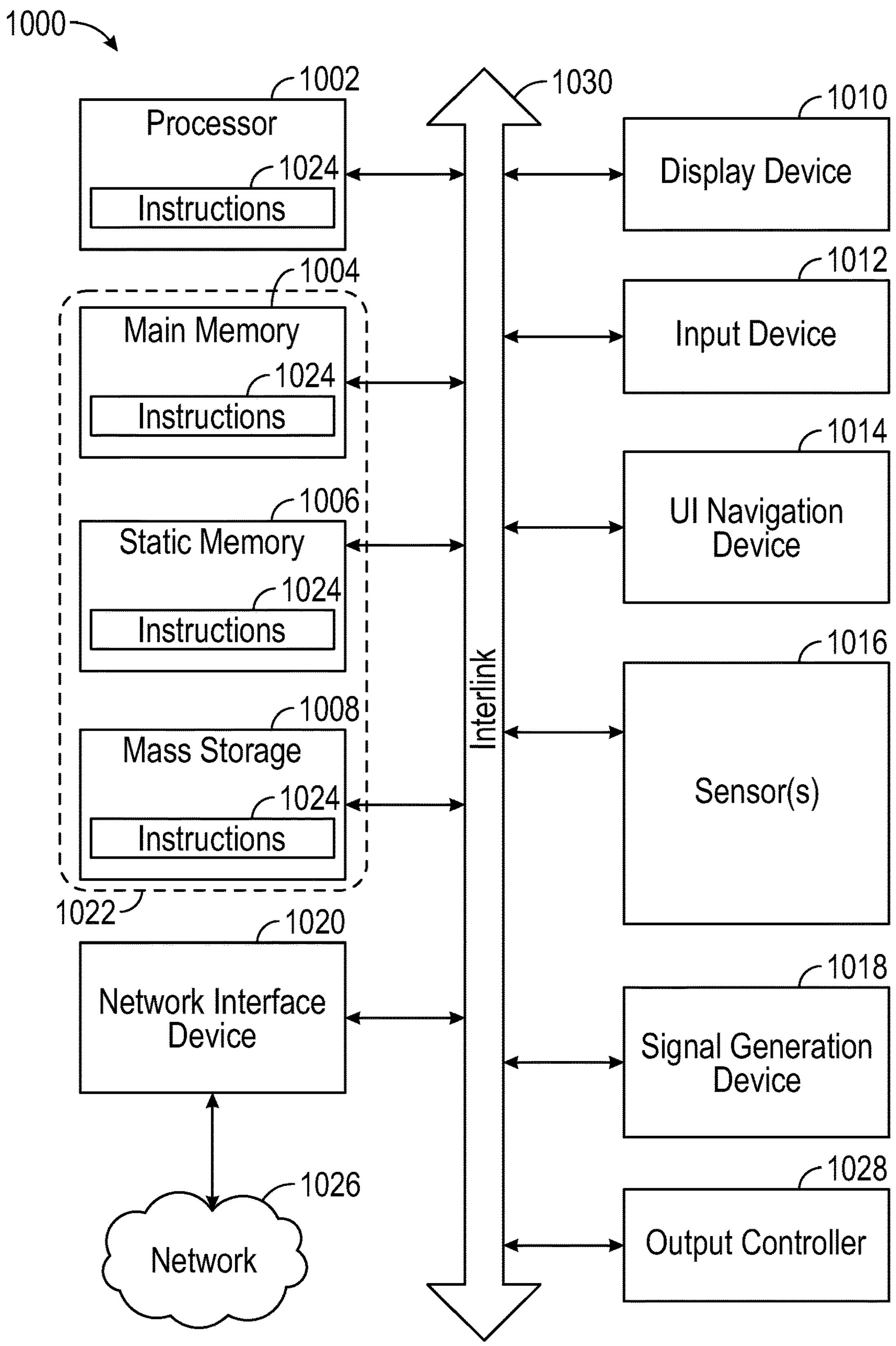
FIG. 10 is a block diagram of an example comprising a machine upon which one or more portions of the present disclosure may be implemented.

FIG. 10 is a block diagram of an example comprising a machine 1000 upon which one or more portions of the present disclosure may be implemented. Examples, as described herein, may include, or may operate by, logic or a number of components, or mechanisms in the machine 1000. Circuitry (e.g., processing circuitry) is a collection of circuits implemented in tangible entities of the machine 1000 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 1000 follow.

In alternative embodiments, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in peer-to-peer (P2P) (or other distributed) network environment. The machine 1000 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (Saas), other computer cluster configurations.

The machine (e.g., computer system) 1000 may include a hardware processor 1002 (e.g., a central processing unit (CPU), a graphics processing unit (GPU), a hardware processor core, or any combination thereof), a main memory 1004, a static memory (e.g., memory or storage for firmware, microcode, a basic-input-output (BIOS), unified extensible firmware interface (UEFI), etc.) 1006, and mass storage 1008 (e.g., hard drives, tape drives, flash storage, or other block devices) some or all of which may communicate with each other via an interlink (e.g., bus) 1030. The machine 1000 may further include a display unit 1010, an alphanumeric input device 1012 (e.g., a keyboard), and a user interface (UI) navigation device 1014 (e.g., a mouse). In an example, the display unit 1010, input device 1012 and UI navigation device 1014 may be a touch screen display. The machine 1000 may additionally include a storage device (e.g., drive unit) 1008, a signal generation device 1018 (e.g., a speaker), a network interface device 1020, and one or more sensors 1016, such as a global positioning system (GPS) sensor, compass, accelerometer, or other sensor. The machine 1000 may include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 1002, the main memory 1004, the static memory 1006, or the mass storage 1008 may be, or include, a machine readable medium 1022 on which is stored one or more sets of data structures or instructions 1024 (e.g., software) embodying or utilized by any one or more of the techniques or functions described herein. The instructions 1024 may also reside, completely or at least partially, within any of registers of the processor 1002, the main memory 1004, the static memory 1006, or the mass storage 1008 during execution thereof by the machine 1000. In an example, one or any combination of the hardware processor 1002, the main memory 1004, the static memory 1006, or the mass storage 1008 may constitute the machine readable media 1022. While the machine readable medium 1022 is illustrated as a single medium, the term "machine readable medium" may include a single medium or multiple media (e.g., a centralized or distributed database, and/or associated caches and servers) configured to store the one or more instructions 1024.

The term "machine readable medium" may include any medium that is capable of storing, encoding, or carrying instructions for execution by the machine 1000 and that cause the machine 1000 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

In an example, information stored or otherwise provided on the machine readable medium 1022 may be representative of the instructions 1024, such as instructions 1024 themselves or a format from which the instructions 1024 may be derived. This format from which the instructions 1024 may be derived may include source code, encoded instructions (e.g., in compressed or encrypted form), packaged instructions (e.g., split into multiple packages), or the like. The information representative of the instructions 1024 in the machine readable medium 1022 may be processed by processing circuitry into the instructions to implement any of the operations discussed herein. For example, deriving the instructions 1024 from the information (e.g., processing by the processing circuitry) may include: compiling (e.g., from source code, object code, etc.), interpreting, loading, organizing (e.g., dynamically or statically linking), encoding, decoding, encrypting, unencrypting, packaging, unpackaging, or otherwise manipulating the information into the instructions 1024.

In an example, the derivation of the instructions 1024 may include assembly, compilation, or interpretation of the information (e.g., by the processing circuitry) to create the instructions 1024 from some intermediate or preprocessed format provided by the machine readable medium 1022. The information, when provided in multiple parts, may be combined, unpacked, and modified to create the instructions 1024. For example, the information may be in multiple compressed source code packages (or object code, or binary executable code, etc.) on one or several remote servers. The source code packages may be encrypted when in transit over a network and decrypted, uncompressed, assembled (e.g., linked) if necessary, and compiled or interpreted (e.g., into a library, stand-alone executable etc.) at a local machine, and executed by the local machine.

The instructions 1024 may be further transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), LoRa/LoRaWAN, or satellite communication networks, mobile telephone networks (e.g., cellular networks such as those complying with 3G, 4G LTE/LTE-A, or 5G standards), Plain Old Telephone (POTS) networks, and wireless data networks (e.g., Institute of Electrical and Electronics Engineers (IEEE) 802.11 family of standards known as Wi-Fi®, IEEE 802.15.4 family of standards, peer-to-peer (P2P) networks, among others. In an example, the network interface device 1020 may include one or more physical jacks (e.g., Ethernet, coaxial, or phone jacks) or one or more antennas to connect to the communications network 1026. In an example, the network interface device 1020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1000, and includes digital or analog communications signals or other intangible medium to facilitate communication of such software. A transmission medium is a machine readable medium.

Additional Notes & Examples

Example 1 is an integrated electronic module assembly, comprising: a substrate comprising conductive regions on opposite surfaces of the substrate; and a laminated bridge assembly, the laminated bridge assembly comprising: a dielectric material, the dielectric material forming a planar region and respective legs defining a cavity region, the respective legs including at least one respective inter-layer interconnection; and a conductive layer, the conductive layer defining at least one respective pad region electrically coupled to the at least one respective inter-layer interconnection; wherein the laminated bridge assembly is electrically and mechanically coupled to the substrate, the substrate comprising a first surface including a respective conductive region to which the at least one respective inter-layer interconnection is electrically coupled and an opposite second surface including respective conductive regions forming terminals of the integrated electronic module assembly.

In Example 2, the subject matter of Example 1 optionally includes wherein the at least one respective inter-layer interconnection comprises a via structure or a metallic slug, the via structure or metallic slug mechanically supported by the dielectric material.

In Example 3, the subject matter of any one or more of Examples 1-2 optionally include at least one passive component electrically and mechanically coupled with the at least one respective pad region.

In Example 4, the subject matter of Example 3 optionally includes wherein the at least one passive component is located on a surface of the dielectric material opposite the cavity region.

In Example 5, the subject matter of any one or more of Examples 1-4 optionally include wherein a configuration of the at least one respective pad region is arranged to allow stacking of one or more laminated bridge assemblies upon each other to provide electrical and mechanical interconnection between the one or more laminated bridge assemblies and the substrate.

In Example 6, the subject matter of any one or more of Examples 1-5 optionally include wherein a configuration of the at least one respective pad region is arranged to allow stacking of one or more integrated electronic module assemblies upon each other to provide electrical and mechanical interconnection between the one or more integrated electronic module assemblies.

In Example 7, the subject matter of any one or more of Examples 1-6 optionally include In Example 8, the subject matter of any one or more of Examples 1-7 optionally include wherein the planar region defines at least one aperture to allow for an encapsulant or coating to penetrate the cavity region.

In Example 9, the subject matter of any one or more of Examples 1-8 optionally include wherein the laminated bridge assembly comprises respective conductive regions configured for electrical interconnection to electrical components on opposite surfaces.

In Example 10, the subject matter of Example 9 optionally includes an integrated circuit package electrically and mechanically coupled with a respective conductive region of the laminated bridge assembly in the cavity region.

In Example 11, the subject matter of any one or more of Examples 9-10 optionally include a second laminated assembly electrically and mechanically coupled with a respective conductive region of the laminated bridge assembly in the cavity region.

In Example 12, the subject matter of any one or more of Examples 1-11 optionally include wherein the planar region is shaped to fit around respective components mounted on the substrate.

In Example 13, the subject matter of any one or more of Examples 1-12 optionally include wherein a length of a power node inter-layer interconnection is larger than a length of a control node inter-layer interconnection.

In Example 14, the subject matter of any one or more of Examples 1-13 optionally include a metallic slug attached to a surface of the laminated bridge assembly in the cavity region, the metallic slug configured to dissipate heat.

Example 15 is an integrated electronic module assembly, comprising: a substrate; and a laminated bridge assembly, the laminated bridge assembly comprising: a dielectric material, the dielectric material forming a planar region and respective legs defining a cavity region, the respective legs including at least one respective inter-layer interconnection; and a conductive layer, the conductive layer defining at least one respective pad region electrically coupled to the at least one respective inter-layer interconnection; wherein the laminated bridge assembly is electrically and mechanically coupled to the substrate, wherein the integrated electronic module assembly provides a switching converter, wherein the laminated bridge assembly is electrically and mechanically coupled to an inductor that acts as an energy storage device.

In Example 16, the subject matter of Example 15 optionally includes an integrated circuit package electrically and mechanically coupled to the laminated bridge assembly, wherein the integrated circuit package is positioned in the cavity region, wherein the inductor is positioned on a surface of the laminated bridge assembly opposite the cavity region.

Example 17 is a method of manufacturing an integrated circuit module assembly, the method comprising: placing a laminated bridge assembly on a substrate, the laminated bridge assembly comprising: a dielectric material, the dielectric material forming a planar region and respective legs defining a cavity region, the respective legs including at least one respective inter-layer interconnection; and a conductive layer, the conductive layer defining at least one respective pad region electrically coupled to the at least one respective inter-layer interconnection; and coupling, electrically and mechanically, the laminated bridge assembly to the substrate, wherein the substrate includes a conductive region electrically coupled to the at least one respective inter-layer interconnection.

In Example 18, the subject matter of Example 17 optionally includes placing a passive component on the planar region; and coupling, electrically and mechanically, the passive component to the planar region, including electrically coupling the passive component to the at least one respective pad region.

In Example 19, the subject matter of any one or more of Examples 17-18 optionally include forming the respective legs by removing dielectric material between the respective legs.

In Example 20, the subject matter of Example 19 optionally includes wherein the forming the respective legs by removing dielectric material includes removing dielectric material through mechanical machining.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including"

and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc., are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Such instructions can be read and executed by one or more processors to enable performance of operations comprising a method, for example. The instructions are in any suitable form, such as but not limited to source code, compiled code, interpreted code, executable code, static code, dynamic code, and the like.

Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An integrated electronic module assembly, comprising:

a substrate comprising conductive regions on opposite surfaces of the substrate; and a laminated bridge assembly, the laminated bridge assembly comprising:

a dielectric material, the dielectric material forming a planar region and respective legs defining a cavity region, the respective legs including at least one respective inter-layer interconnection; and a conductive layer, the conductive layer defining at least one respective pad region electrically coupled to the at least one respective inter-layer interconnection;

wherein the laminated bridge assembly is electrically and mechanically coupled to the substrate, the substrate comprising a first surface including a respective conductive region to which the at least one respective inter-layer interconnection is electrically coupled and an opposite second surface including respective conductive regions forming terminals of the integrated electronic module assembly.

2. The integrated electronic module assembly of claim 1, wherein the at least one respective inter-layer interconnection comprises a via structure or a metallic slug, the via structure or metallic slug mechanically supported by the dielectric material.

3. The integrated electronic module assembly of claim 1, comprising at least one passive component electrically and mechanically coupled with the at least one respective pad region.

4. The integrated electronic module assembly of claim 3, wherein the at least one passive component is located on a surface of the dielectric material opposite the cavity region.

5. The integrated electronic module assembly of claim 1, wherein a configuration of the at least one respective pad region is arranged to allow stacking of one or more laminated bridge assemblies upon each other to provide electrical and mechanical interconnection between the one or more laminated bridge assemblies and the substrate.

6. The integrated electronic module assembly of claim 1, wherein a configuration of the at least one respective pad region is arranged to allow stacking of one or more integrated electronic module assemblies upon each other to provide electrical and mechanical interconnection between the one or more integrated electronic module assemblies.

7. The integrated electronic module assembly of claim 1 wherein a ratio of a height of respective legs to a width of the respective legs exceeds 4:1.

8. The integrated electronic module assembly of claim 1, wherein the planar region defines at least one aperture to allow for an encapsulant or coating to penetrate the cavity region.

9. The integrated electronic module assembly of claim 1, wherein the laminated bridge assembly comprises respective conductive regions configured for electrical interconnection to electrical components on opposite surfaces.

10. The integrated electronic module assembly of claim 9, comprising an integrated circuit package electrically and mechanically coupled with a respective conductive region of the laminated bridge assembly in the cavity region.

11. The integrated electronic module assembly of claim 9, comprising a second laminated assembly electrically and mechanically coupled with a respective conductive region of the laminated bridge assembly in the cavity region.

12. The integrated electronic module assembly of claim 1, wherein the planar region is shaped to fit around respective components mounted on the substrate.

13. The integrated electronic module assembly of claim 1, wherein a length of a power node inter-layer interconnection is larger than a length of a control node inter-layer interconnection.

14. The integrated electronic module assembly of claim 1, comprising a metallic slug attached to a surface of the laminated bridge assembly in the cavity region, the metallic slug configured to dissipate heat.

15. An integrated electronic module assembly, comprising:

a substrate; and a laminated bridge assembly, the laminated bridge assembly comprising:

a dielectric material, the dielectric material forming a planar region and respective legs defining a cavity region, the respective legs including at least one respective inter-layer interconnection; and a conductive layer, the conductive layer defining at least one respective pad region electrically coupled to the at least one respective inter-layer interconnection;

wherein the laminated bridge assembly is electrically and mechanically coupled to the substrate, wherein the integrated electronic module assembly provides a switching converter, wherein the laminated bridge assembly is electrically and mechanically coupled to an inductor that acts as an energy storage device.

16. The integrated electronic module assembly of claim 15, comprising an integrated circuit package electrically and mechanically coupled to the laminated bridge assembly, wherein the integrated circuit package is positioned in the cavity region, wherein the inductor is positioned on a surface of the laminated bridge assembly opposite the cavity region.

17. A method of manufacturing an integrated circuit module assembly, the method comprising:

placing a laminated bridge assembly on a substrate, the laminated bridge assembly comprising:

a dielectric material, the dielectric material forming a planar region and respective legs defining a cavity region, the respective legs including at least one respective inter-layer interconnection; and a conductive layer, the conductive layer defining at least one respective pad region electrically coupled to the at least one respective inter-layer interconnection; and coupling, electrically and mechanically, the laminated bridge assembly to the substrate, wherein the substrate includes a conductive region electrically coupled to the at least one respective inter-layer interconnection.

18. The method of claim 17, comprising:

placing a passive component on the planar region; and coupling, electrically and mechanically, the passive component to the planar region, including electrically coupling the passive component to the at least one respective pad region.

19. The method of claim 17, comprising forming the respective legs by removing dielectric material between the respective legs.

20. The method of claim 19, wherein the forming the respective legs by removing dielectric material includes removing dielectric material through mechanical machining.

* * * * *